United States Patent
Li et al.

(10) Patent No.: US 10,135,426 B1
(45) Date of Patent: Nov. 20, 2018

(54) GATE CHARGE AND DISCHARGE REGULATING CIRCUIT FOR GATE CONTROL DEVICE

(71) Applicants: University of Electronic Science and Technology of China, Chengdu (CN); Institute of Electronic and Information Engineering of UESTC in Guangdong, Dongguan (CN)

(72) Inventors: Zehong Li, Chengdu (CN); Xiao Zeng, Chengdu (CN); Yuzhou Wu, Chengdu (CN); Jiali Wan, Chengdu (CN)

(73) Assignees: University of Electronic Science and Technology of China, Chengdu (CN); Institute of Electronic and Information Engineering of UESTC in Guangdong, Dongguan (CN)

( * ) Notice: Subject to any disclaimer, the term of this patent is extended or adjusted under 35 U.S.C. 154(b) by 0 days.

(21) Appl. No.: 15/960,580

(22) Filed: Apr. 24, 2018

(30) Foreign Application Priority Data

Sep. 26, 2017 (CN) .......................... 2017 1 0879997

(51) Int. Cl.
*H03K 3/012* (2006.01)
*H03K 17/041* (2006.01)
*H03K 17/16* (2006.01)

(52) U.S. Cl.
CPC ....... *H03K 3/012* (2013.01); *H03K 17/04106* (2013.01); *H03K 17/165* (2013.01)

(58) Field of Classification Search
CPC ............. H03K 3/012; H03K 17/04106; H03K 17/0412; H03K 17/04123; H03K 17/162; H03K 17/165
USPC .................................................... 327/108, 109
See application file for complete search history.

(56) References Cited

U.S. PATENT DOCUMENTS

| 5,929,665 | A | * | 7/1999 | Ichikawa | ................ | H01L 29/00 327/109 |
| 2017/0149330 | A1 | * | 5/2017 | Osanai | ............. | H03K 17/04123 |

* cited by examiner

*Primary Examiner* — William Hernandez
(74) *Attorney, Agent, or Firm* — Gokalp Bayramoglu

(57) ABSTRACT

A gate charge and discharge adjustment regulating circuit for a gate control device belongs to the power electronics technology field. The switch control signal is connected to the control terminals of the four analog switches. The gate control signal is loaded on the gate of the correct field effect transistor under the action of the four analog switches to control the switching-on degree so as to achieve the purpose of adjusting the gate driving signal current, that is, regulating the gate charge and discharge currents of the gate control device to realize the change of the switching characteristics and conduction characteristics. The switch control signal is connected to the input terminal of the gate driving module to control the gate driving module to generate the gate driving signal.

3 Claims, 5 Drawing Sheets

GATE CHARGE AND DISCHARGE REGULATING CIRCUIT FOR GATE CONTROL DEVICE

CROSS REFERENCE TO RELATED APPLICATIONS

This application is based on and claims priority to the Chinese patent application No. 201710879997.6, filed on Sep. 26, 2017, the entire contents of which are incorporated herein by reference.

TECHNICAL FIELD

The invention belongs to the field of power electronics technology, specifically relates to a gate charge and discharge regulating circuit for a gate control device.

BACKGROUND

In the field of power electronics, the gate control device is a voltage-controlled power gate control device, including VDMOS, LDMOS, IGBT, MCT, etc. With the development of power electronics technology, the power electronic systems, using gate control device as the core power gate control device, have also increased their requirements for the basic application technology, one of which is the dynamic gate control technology of gate control device.

Dynamic gate control is a technique that adjusts the gate driving signal of the gate control device to improve the switching performance of the gate control device. The technology can be integrated in the gate drive integrated circuit of the gate control device or between the gate drive circuit and the gate of the gate control device. This technology changes the changing rate of collector current (di/dt), voltage changing rate (dv/dt), current overshoot, voltage overshoot, etc., of the gate control device in the switch-on and switch-off transient states to optimize the switching rate, switching losses, and electromagnetic interference (EMI) transients in the switch-on and switch-off transient states.

According to the research of this technology, there are several methods such as variable current source, gate voltage regulation of the gate control device, and dynamic gate resistance. But in practical applications, the dynamic gate control technology is limited due to its complexity and unavailability. At the same time, it is hardly reflected in commercialized driver chips.

SUMMARY

The purpose of the present invention is, to address the above-mentioned applications and requirements, and to promote the development and popularization of the dynamic gate control technology of the gate control device, to provide a gate charge and discharge regulating circuit for gate control device. The circuit is simple, effective, full-featured, is capable of being integrated, etc., which can solve the problem of execution of the dynamic gate control.

The Technical Scheme of the Invention is as Follows:

A gate charge and discharge regulating circuit for a gate control device includes the first analog switch S1, the second analog switch S2, the third analog switch S3, and the fourth analog switch S4, the first diode D1, the second diode D2, the third diode D3, the fourth diode D4, the first resistor R1, the second resistor R2, the first N-type field effect transistor M1, the second N-type field effect transistor M2 and the first P-type field effect transistor M3; the switch control signal is connected to the control terminals of the first analog switch S1, the second analog switch S2, the third analog switch S3 and the fourth analog switch S4, the gate driving signal is connected to the anode of the first diode D1 and the cathode of the fourth diode D4; the gate of the first N-type field effect transistor M1 is connected to one end of the first analog switch S1 and one end of the second analog switch S2, the source of the first N-type field effect transistor M1 is connected to the other end of the first analog switch S1, the anode of the second diode D2 and the gate of the first P-type field effect transistor M3; the drain of first N-type field effect transistor M1 is connected to the cathode of the first diode D1; the other end of the second analog switch S2 and one end of the third analog switch S3 are connected to the gate control signal, and the other end of the third analog switch S3 is connected to one end of the fourth analog switch S4 and passes through the first resistor R1 to be connected to the gate of the second N-type field effect transistor M2; the source of the second N-type field effect transistor M2 is connected to the anode of the fourth diode D4 and the other end of the fourth analog switch S4 and passes through the second resistor R2 to be connected to the gate of the second N-type field effect transistor M2; the drain of the second N-type field effect transistor M2 is connected to the cathode of the third diode D3; the source of the first P-type field effect transistor M3 is connected to the cathode of the second diode D2 and the anode of the third diode D3 and serves as an output end of the gate charge and discharge regulating circuit, the drain of the first P-type field effect transistor M3 is grounded.

Specifically, with reference to the low level of the switch control signal, the first analog switch S1 and the third analog switch S3 are set as the normal close contacts, the second analog switch S2 and the fourth analog switch S4 are set as the normal open contacts.

Specifically, the gate driving signal is generated by a gate driving module, and the gate driving module includes a first transistor Q1, the second transistor Q2 and the third resistor R3; one end of the third resistor R3 is connected to the switch control signal as the input end of the gate driving module; the other end of the third resistor R3 is connected to the base of the first transistor Q1 and the second transistor Q2; the collector of the first transistor Q1 is connected to the supply voltage, and the emitter of the first transistor Q1 is connected to the emitter of the second transistor Q2 and serves as the output end of the gate driving module to output the gate driving signal; the collector of the second transistor Q2 is grounded.

The beneficial effects of the present invention are as follows: the present invention adjusts the gate current of the gate control device to realize the adjustment of the switching characteristics and the conduction characteristics of the gate control device, and has the advantages of being simple, effective, full-featured, and integrable, etc.; it is especially suitable for the use in balancing and controlling the branch current of each gate control device when the gate control devices are connected in parallel.

BRIEF DESCRIPTION OF THE DRAWINGS

FIG. 6 is a schematic diagram of the restrain effect of the circuit of the present invention on the collector current overshoot and oscillation when the IGBT is switched on.

DETAILED DESCRIPTION

The specific implementation of the present invention will be described below with reference to the accompanying drawings and the specific embodiment.

Based on the physical characteristics and principles of the gate control device, the switch-on and switch-off of the gate control device are regarded as processes of charging and discharging the gate input capacitor, respectively. Since the charging and discharging will directly affect the switching characteristics, this invention provides a gate charge and discharge regulating circuit for a gate control device, which realizes the charge adjustment of the charge and discharge charge of the gate control device. It is reflected as the current adjustment of the gate drive so as to realize the change of the switching characteristics of the gate control device.

Figure 1:
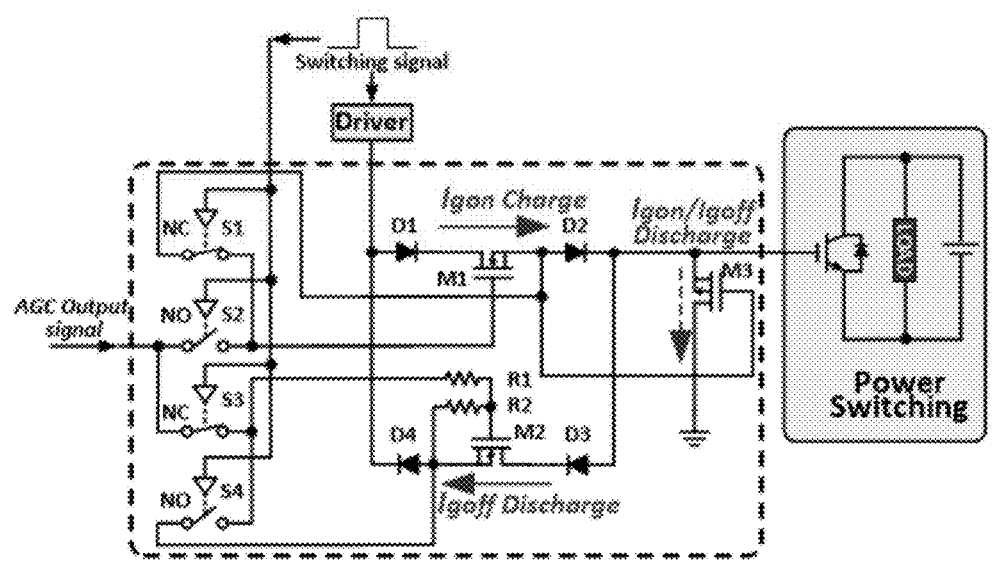
FIG. 1 is a structural diagram of a gate charge and discharge regulating circuit for a gate control device provided by the present invention.

As shown in the dashed box in FIG. 1, the gate charge and discharge regulating circuit provided by the present invention is shown. The switch control signal is a digital signal from an external controller. The gate driving signal in this embodiment is also generated by the switch control signal. The switch control signal is connected to the input terminal of the gate driving module, controlling the gate driving module to generate the gate driving signal; the gate control signal is an analog signal and also from an external controller; the output signal of the present invention is a regulated gate current signal of the gate control device, which is directly connected to the gate of the gate control device. The switch control signal is connected to the control terminals of the four analog switches to realize the control of the four analog switches. Referring to the low level of the switch control signal, the first analog switch S1 and the fourth analog switch S3 are set as normal close contacts, the second analog switch S2 and the fourth analog switch S4 are set as normal open contacts. The gate control signal is applied to the gate of the correct field effect transistor under the action of the four analog switches to control the switching-on degree of field effect transistor so as to achieve the purpose of regulating the current of the gate driving signal, i.e. regulating the charge-discharge gate current of the gate of the gate control device to achieve a change in the switching characteristics and conduction characteristics.

As shown in FIG. 1, the first diode D1, the first N-type field effect transistor M1, the second diode D2 and the first P-type field effect transistor M3 constitute the gate charge and discharge current regulation loops from off-state to on-state and in on-state to control the switch-on and switch-off of the gate control device; the first P-type field effect transistor M3, a third transistor D3, the second N-type field effect transistor M2 and a fourth diode D4 constitute gate discharge current regulating circuit of gate control device from the on-state to the off-state to control the switch-off and cut-off of the gate control device. Two divider resistors, the first resistor R1 and the second resistor R2, are disposed on the gate of the second N-type gate field effect transistor M2 to ensure the correct switch-on and switch-off control logic of the second N-type field effect transistor M2 when the gate driving signal pulls the gate of the gate control device to a negative voltage.

Figure 2:
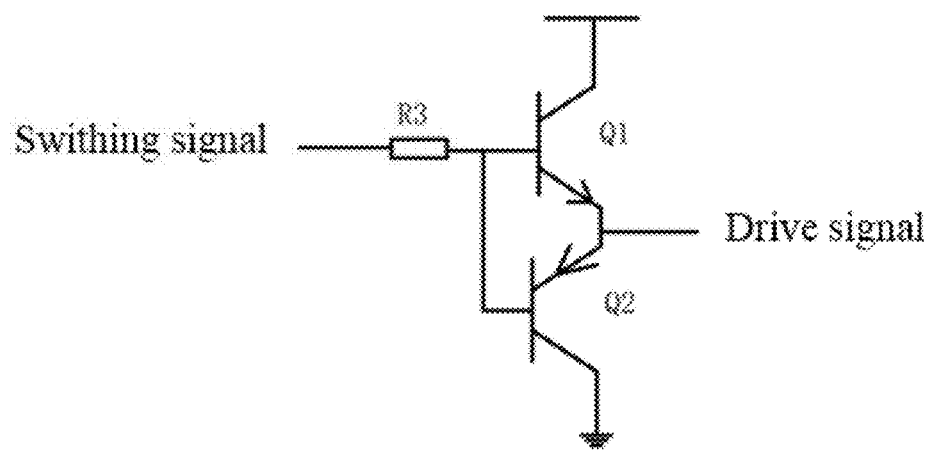
FIG. 2 is a schematic diagram of a circuit of a gate driving module in the embodiment.

As shown in FIG. 2, a circuit implementation circuit of gate driving module includes the first transistor Q1, the second transistor Q2 and the third resistor R3. One end of the third resistor R3 serves as an input terminal of the gate driving module to be connected to the switch control signal, and the other end of the third resistor R3 is connected to the base of the first transistor Q1 and the second transistor Q2. The collector of the first transistor Q1 is connected to the supply voltage. The emitter of the first transistor Q1 is connected to the emitter of the second transistor Q2 and serves as the output end of gate driving module to output the gate driving signal. The collector of the second transistor Q2 is grounded.

The working process of the present invention will be described in detail taking an insulated gate bipolar transistor IGBT as an example.

Figure 3:
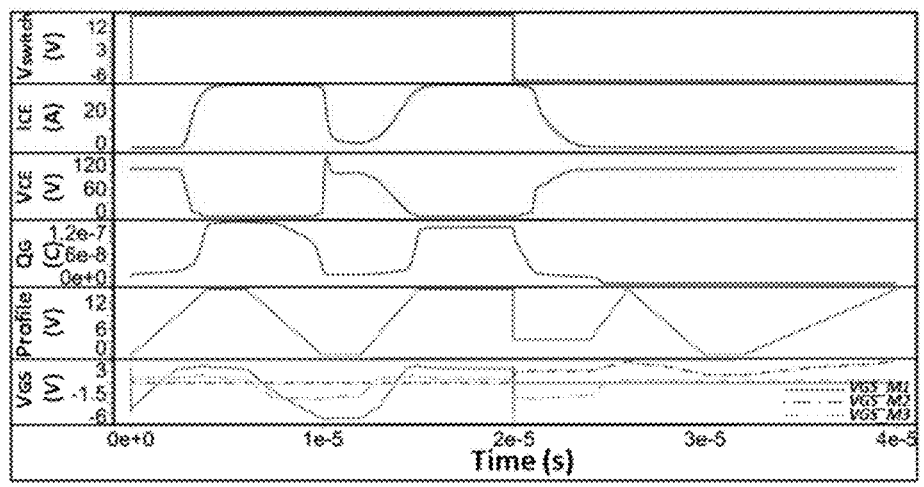
FIG. 3 is a simulation diagram of the regulating gate current working state of the gate control device IGBT.
Figure 4:
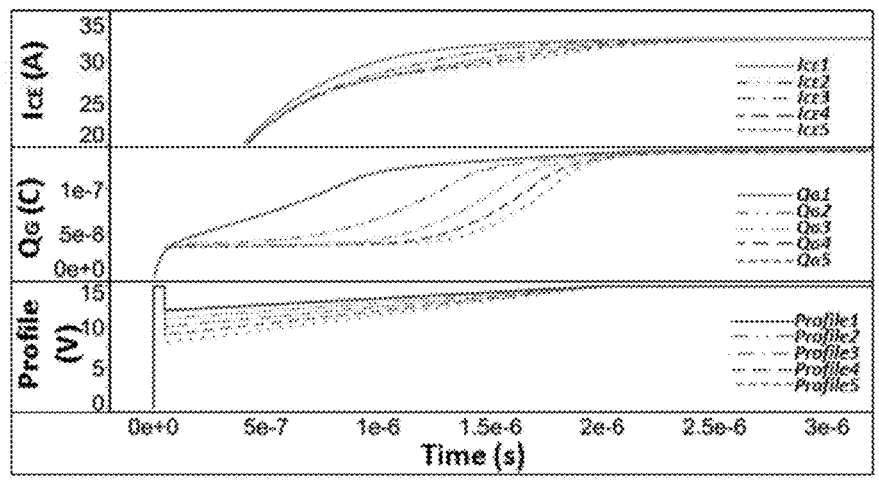
FIG. 4 is a diagram showing a relation between a gate control signal profile and a collector current $I_{CE}$ and a gate charge $Q_G$ when the IGBT is switched on in the circuit of the present invention.
Figure 5:
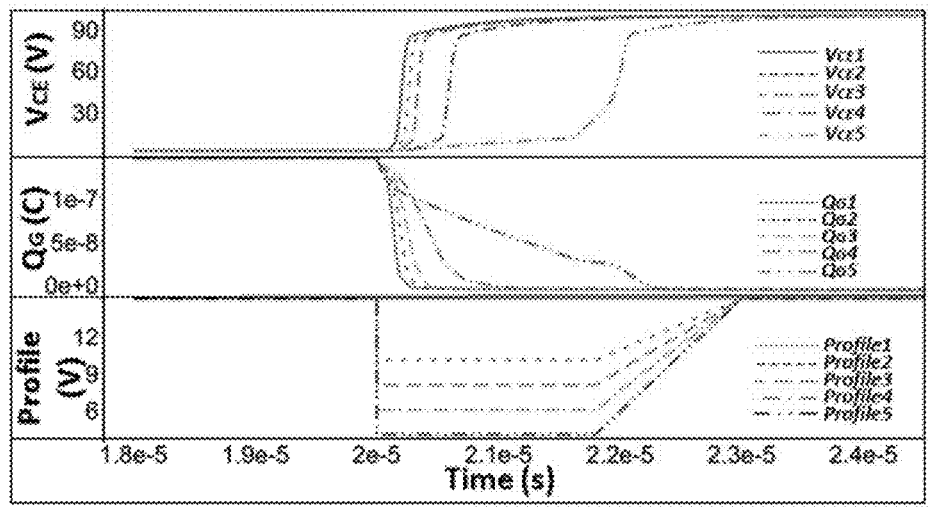
FIG. 5 is a diagram showing a relation between a gate control signal profile and a collector voltage $V_{CE}$ and a gate charge $Q_G$ when the IGBT is switched off in the circuit of the present invention.
Figure 6:
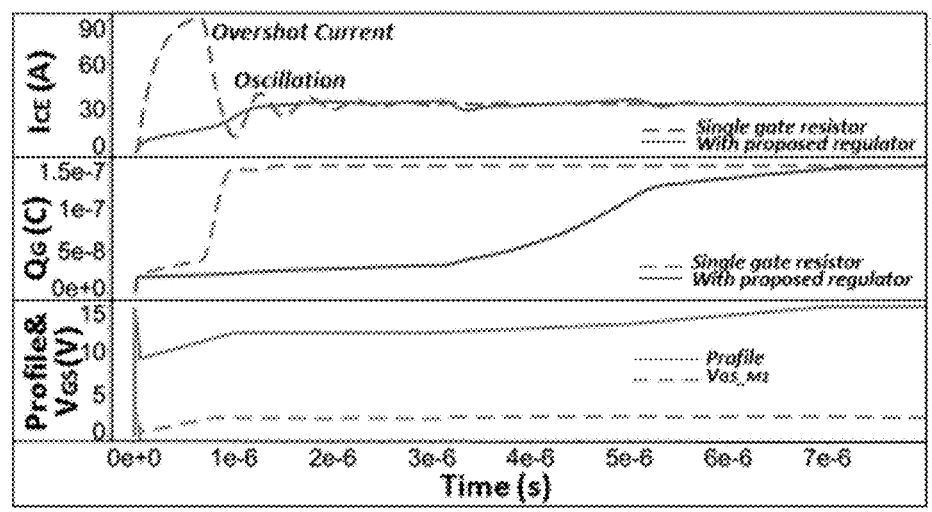
Figure 7:
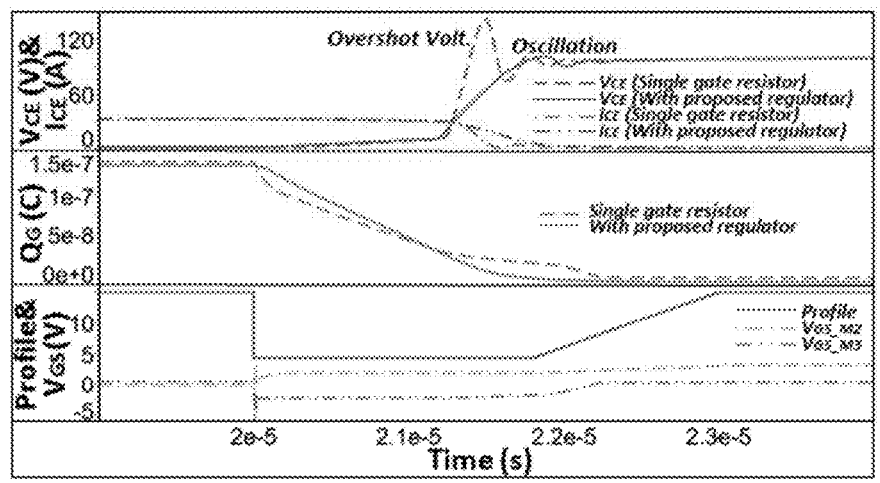
FIG. 7 is a schematic diagram of the restrain effect of the circuit of the present invention on the collector voltage overshoot and oscillation when the IGBT is switched off.
Figure 8:
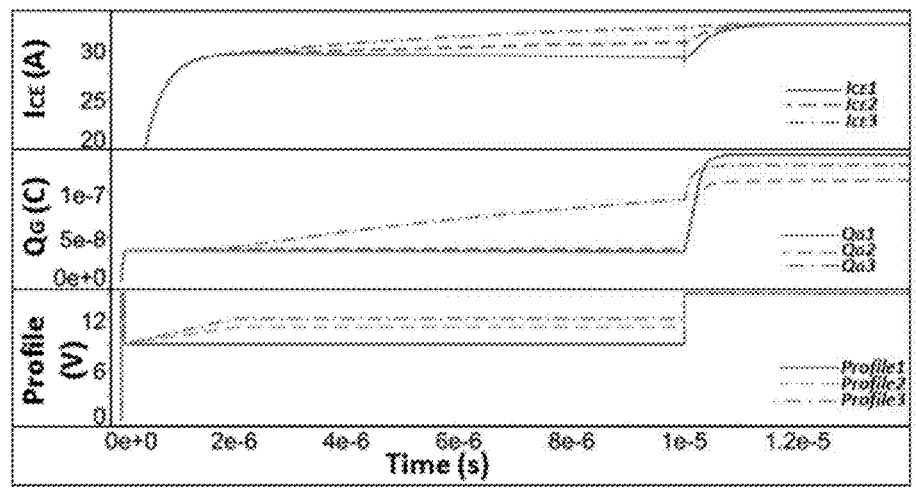
FIG. 8 is a schematic diagram of regulation action of the circuit of the present invention on increasing the collector current when the IGBT is in a conducting state.
Figure 9:
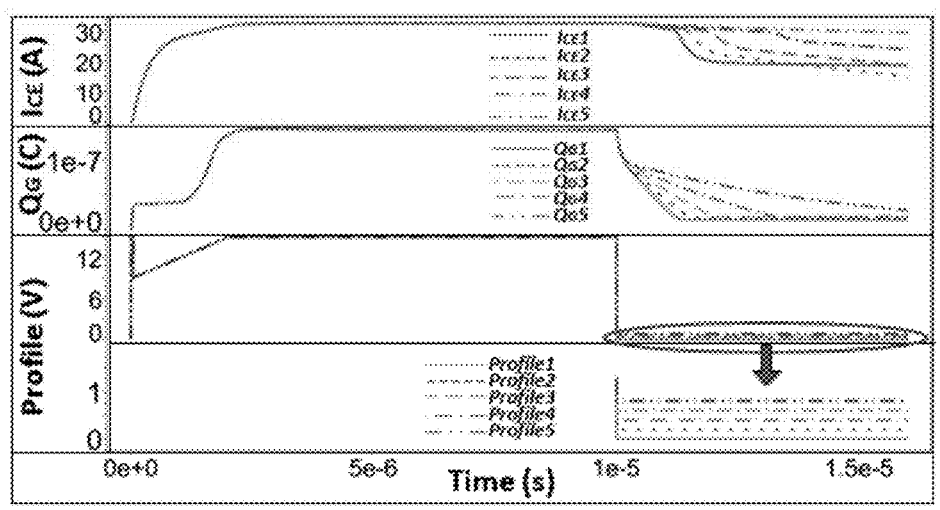
FIG. 9 is a schematic diagram of regulation action of the circuit of the present invention on reducing the collector current when the IGBT is in a conducting state.

The profile in FIG. 3 is a gate control signal from the outside. This signal is determined by an external controller. It can be manually adjusted and solidified in an external controller according to a specific gate control device application circuit and can also be automatically generated by input algorithm in external control. $V_{switch}$ is the switch control signal of IGBT, $I_{CE}$ is the collector-emitter current of IGBT, $V_{CE}$ is the collector-emitter voltage of IGBT, $Q_G$ is the gate charge of IGBT, and $V_{GS\_M1}$ is the gate-source voltage of the first N-type field effect transistor M1, $V_{GS\_M2}$ is the gate-source voltage of the second N-type field effect transistor M2, and $V_{GS\_M3}$ is the gate-source voltage of the first P-type field effect transistor M3.

As can be seen in FIG. 3, the change of the gate control signal profile causes the changes of gate voltages $V_{GS}$ of the first N-type field effect transistor M1, the second N-type field effect transistor M2, and the first P-type field effect transistor M3, thereby causing the change of the gate charge $Q_G$ of the IGBT (i. e, the change of the gate current). Eventually, the collector current ($I_{CE}$) and voltage ($V_{CE}$) of the gate control device change, especially when the gate control device is switched on.

When the gate control device is switched on, the first analog switch S1 and the third analog switch S3 are disconnected, and the second analog switch S2 and the fourth analog switch S4 are connected. At this time, the second analog switch S2 loads the gate control signal profile to the gate of the first N-type field effect transistor M1 so that the first N-type field effect transistor M1 is switched on in different degrees under the action of the gate control signal profile; the fourth analog switch S4 short-circuits the gate and the source of the second N-type analog switch M2 through the first resistor R1 so that the second N-type field effect transistor M2 is in the off-state. It can be seen from FIG. 3 that the gate-source voltage $V_{GS\_M1}$ of the first N-type field effect transistor M1 increases with the increase of voltage of the gate control signal profile under the action of the gate control signal profile. Gate-source voltage $V_{GS\_M2}$ of the second N-type field effect transistor M2 is 0V, the gate-source voltage $V_{GS\_M2}$ of the first P-type field effect transistor M3 is positive, so that the first P-type field effect transistor M3 is also switched off. At this time, the gate of the gate control device is in the charging state, and the charging current is determined by the gate control signal profile. The collector current and the collector voltage of the gate control device increase and decrease at different rates, respectively, as the gate control signal profile changes.

After the gate control device is switched on, the gate control signal profile in FIG. 3 stabilizes for a period of time and then gradually decreases. At this time, it can be seen that the gate-source voltage $V_{GS\_M1}$ of the first N-type field effect transistor M1 decreases with the gate control signal profile, and gradually reaches the off-state, meanwhile, the gate-source voltage $V_{GS\_M3}$ of the first P-type field effect transistor M3 is gradually pulled down to a negative value. Since the first P-type field effect transistor M3 is a P-type field effect transistor, it is gradually switched on as the gate control signal decreases, so that in the conduction state of the gate control device, the gate generates a discharge current, then the collector current $I_{CE}$ of the gate control device decreases and the collector voltage $V_{CE}$ of the gate control device increases. At this time, the second N-type field effect transistor M2 is still in the off-state.

After the process is completed, as shown in FIG. 3, in the state that the drive signal is at the high level, the gate control signal profile begins to increase, so that the gate-source voltage $V_{GS\_M1}$ of the first N-type field effect transistor M1 and the gate-source voltage $V_{GS\_M3}$ of the first p-type field effect transistor M3 gradually increase, causing the first N-type field effect transistor M1 to be gradually switched on, and the first P-type field effect transistor M3 to be gradually switched off, thereby causing the collector current $I_{CE}$ of the gate control device to gradually ascend and the collector voltage $V_{CE}$ of the gate control device gradually decrease. At this time, the second N-type field effect transistor M2 is still in the off-state. The above process realizes the regulation of the collector current $I_{CE}$ of the gate control device in the on-state.

In FIG. 3, when the switch control signal $V_{switch}$ changes from a high level to a low level, the first analog switch S1 and the third analog switch S3 are connected, the second analog switch S2 and the fourth analog switch S4 are disconnected, the third analog switch S3 loads the gate control signal profile to the gate of the second N-type field effect transistor M2. The first analog switch S1 short-circuits the gate and the source of the first N-type field effect transistor M1 to make it switched off. At this time, the set gate control signal profile immediately reduces (profile can be arbitrarily set), so that the first N-type field effect transistor M1 is switched off, and the second N-type field effect transistor M2 and the first P-type field effect transistor M3 are switched on. The gate discharge current is formed under the common action of the second N-type field effect transistor M2 and the first P-type field effect transistor M3, and is determined by the gate control signal profile.

FIG. 4 to FIG. 9 shows the collector current characteristics of the gate control device in on-state, the collector current characteristics of the gate control device in off-state, the collector current overshoot and the oscillation suppression of the gate control device in the on-state, the collector voltage overshoot and oscillation suppression of gate control device in the off-state, the waveform that collector current is turned up and the collector current is turned down in the on-state. This shows that the circuit improves the switching characteristics and conductivity of the gate control device.

The circuit provided by the present invention, is not only able to adjust the gate charge current and discharge current during the processes of switch-on and switch-off of the gate control device, but also able to regulate the gate charge current and discharge current of the gate control device in the on-state, thus changing the collector current. It is very suitable for the balance control of the branch current of each gate control device when the gate control devices are in parallelly-connected application.

The present invention provides a feasible method for the execution of the gate drive control and realizes the drive adjustment by adding the circuit between the drive chip (module or circuit, etc.) and the gate of the gate control device on the premise of keeping the existing drive. Of course, the circuit can also be integrated in the drive integrated circuit chip of gate control device. Therefore, the problem of adjusting the switching characteristics and the conduction characteristics of the gate control device is solved simply and effectively, thereby promoting the application and popularization of the dynamic gate control technology of the gate control device, and having the advantages of being simple, efficient, full-functional, capable of being integrated, etc.

Those skilled in the art may make various other specific variations and combinations without departing from the essence of the present invention based on these technical disclosures disclosed in present invention, and these variations and combinations are still within the protection scope of present invention.

The invention claimed is:

1. A gate charge and discharge regulating circuit for a gate control device, comprising:
   a first analog switch, a second analog switch, a third analog switch, a fourth analog switch, a first diode, a second diode, a third diode, a fourth diode, a first resistor, a second resistor, a first N-type field effect transistor, a second N-type field effect transistor, and a first P-type field effect transistor; wherein
   a switch control signal is connected to control terminals of the first analog switch, the second analog switch, the third analog switch and the fourth analog switch; a gate driving signal is connected to an anode of the first diode and a cathode of the fourth diode;
   a gate of the first N-type field effect transistor is connected to a first end of the first analog switch and a first end of the second analog switch; a source of the first N-type field effect transistor is connected to a second end of the first analog switch, an anode of the second diode and a gate of the first P-type field effect transistor; a drain of first N-type field effect transistor is connected to a cathode of the first diode;
   a second end of the second analog switch and a first end of the third analog switch are connected to a gate control signal, and a second end of the third analog switch is connected to a first end of the fourth analog switch, and the second end of the third analog switch passes through the first resistor and is connected to a gate of the second N-type field effect transistor;
   a source of the second N-type field effect transistor is connected to an anode of the fourth diode and a second end of the fourth analog switch, and the source of the second N-type field effect transistor passes through the second resistor and is connected to the gate of the second N-type field effect transistor; a drain of the second N-type field effect transistor is connected to a cathode of the third diode;

a source of the first P-type field effect transistor is connected to a cathode of the second diode and an anode of the third diode, and the source of the first P-type field effect transistor serves as an output end of the gate charge and discharge regulating circuit, a drain of the first P-type field effect transistor is grounded.

2. The gate charge and discharge regulating circuit for the gate control device according to claim 1, wherein referring to a low level of the switch control signal, the first analog switch and the third analog switch are set as normal close contacts, and the second analog switch and the fourth analog switch are set as normal open contacts.

3. The gate charge and discharge regulating circuit for the gate control device according to claim 1, wherein the gate driving signal is generated by a gate driving module, and the gate driving module comprises a first transistor, a second transistor and a third resistor;

a first end of the third resistor serves as an input end of the gate driving module, and the first end of the third resistor is connected to the switch control signal, a second end of the third resistor is connected to a base of the first transistor and the second transistor; a collector of the first transistor is connected to a supply voltage, and an emitter of the first transistor is connected to an emitter of the second transistor, and the emitter of the first transistor serves as an output end of the gate driving module to output the gate driving signal, a collector of the second transistor is grounded.

* * * * *